United States Patent [19]

Ishijima

[11] Patent Number: 4,876,581
[45] Date of Patent: Oct. 24, 1989

[54] FIELD EFFECT TRANSISTOR WITH SHORT CHANNEL LENGTH AND PROCESS OF FABRICATION THEREOF

[75] Inventor: Toshiyuki Ishijima, Tokyo, Japan

[73] Assignee: NEC Corporation, Tokyo, Japan

[21] Appl. No.: 207,837

[22] Filed: Jun. 17, 1988

[30] Foreign Application Priority Data

Jun. 17, 1987 [JP] Japan .................................. 62-151837

[51] Int. Cl.$^4$ ............................................ H01L 29/78
[52] U.S. Cl. ...................................... 357/23.3; 357/40; 357/23.1
[58] Field of Search ......................... 357/23.3, 40, 23.1

[56] References Cited

U.S. PATENT DOCUMENTS 4,660,062 4/1987 Nishizawa ........................... 357/23.3

Primary Examiner—Andrew J. James
Assistant Examiner—David Soltz
Attorney, Agent, or Firm—Sughrue, Mion, Zinn, Macpeak & Seas

[57] ABSTRACT

For preventing a field effect transistor from the short-channel effects, there is disclosed a field effect transistor comprising a channel region and source/drain regions deviating from the central portion of the channel region in the lateral direction of the field effect transistor, a gate electrode covered with an insulating film intervenes between the source/drain regions, so that the channel length is increased in length.

9 Claims, 6 Drawing Sheets

PRIOR-ART

FIELD EFFECT TRANSISTOR WITH SHORT CHANNEL LENGTH AND PROCESS OF FABRICATION THEREOF

FIELD OF THE INVENTION

This invention relates to a field effect transistor and a process of fabrication thereof and, more particularly, to a structure of the field effect transistor capable of suppression of the short-channel effects.

BACKGROUND OF THE INVENTION

Since the beginning of the integrated circuit era, the minimum device dimension has been scaled down for fabrication of highly complex integrated circuits, and, for this reason, a component field effect transistor incorporated in a very large-scale integration has a minimum device dimension which shrinks into the submicron region. However, the shrinkage in the gate length results in that the short-channel effects tend to take place in the field effect transistor. In general, shallow source and drain regions are conducive to suppression of the short-channel effects, so that various attempts are made for controlling the depth of the source and drain regions. One of the attempts is disclosed in "Formation of Shallow Junction by Ion Implantation", Semiconductor World 1986.2, pages 57 to 65. The paper entitled as "Formation of Shallow Junction by Ion Implantation" proposes that impurity atoms should be implanted through a silicon oxide film or, alternatively, through an amorphous silicon film. The paper also proposes a low energy ion implantation. For example, when n=type shallow source and drain regions 1 and 2 are formed in a p-type silicon substrate 3 during a fabrication process of a MIS-type ( metal insulator semiconductor ) field effect transistor shown in FIG. 1, n-type impurity atoms are implanted into the p-type silicon substrate 3 through a silicon oxide film or an amorphous silicon film ( not shown ) previously applied on the major surface of the p-type silicon substrate 3 using a gate electrode 4 as a mask. After formation of the shallow source and drain regions 1 and 2, an insulating film 5 is deposited on the entire surface of the structure, and, then, contact windows are formed in the insulating film 5 to expose the source and drain regions 1 and 2. On the insulating film 5 is deposited aluminum or an aluminum-silicon alloy which is patterned to form metal wiring layers 6 and 7 connected at one ends thereof to the source and drain regions 1 and 2, respectively.

However, a problem is encountered in the prior-art MIS-type field effect transistor in that an irregularity takes place in the profiles of the source and drain regions 1 and 2 because the silicon oxide film or the amorphous silicon film is varied in thickness. Undesirable ion channelings are increased during the ion-implantation. These deteriorate the reliability of the MIS-type field effect transistor and, accordingly, result in reduction in production yield. Moreover, the shallow source and drain regions 1 and 2 are causative of other drawbacks. Namely, resistance thereof are increased, limitations are set to temperatures and time durations of heat-treatments carried out after formation of the source and drain regions 1 and 2, and aluminum spikes should be taken into account upon selection of material.

SUMMARY OF THE INVENTION

It is therefore an important object of the present invention to provide a MIS-type field effect transistor which is free from the short-channel effects even if the gate length thereof is reduced into submicron region.

It is another important object of the present invention to provide a MIS-type field effect transistor which needs no shallow source and drain regions for suppression of the short-channel effects.

It is still another important object of the present invention to provide a MIS-type field effect transistor which is free from the drawbacks inherent in the prior-art MIS-type field effect transistor with the shallow source and drain regions.

It is still another important object of the present invention to provide a process of fabricating a MIS-type field effect transistor which is free from the short-channel effects without shallow source and drain regions.

To accomplish these objects, the present invention proposes to cause source and drain regions to deviate from a channel forming layer.

In accordance with one aspect of the present invention, there is provided a field effect transistor fabricated on a semiconductor substrate of a first conductivity type, comprising: (a) an insulating film formed on the simiconductor substrate; (b) a semiconductor layer of the first conductivity type formed in the insulating layer and having relatively long protrusions and a relatively short protrusion located between the relatively long protrusions, the semiconductor layer being in contact with the semiconductor substrate; (c) a gate insulating film covering a leading end surface of the relatively short protrusion and respective inner side surfaces of the relatively long protrusions; (d) a gate electrode formed in the insulating film and contacting to the gate insulating film; (e) source and drain regions of a second conductivity type formed in the insulating film and contacting to respective leading ends of the relatively long protrusions, respectively, wherein the source and drain regions are separated from each other by a part of the insulating film and the gate electrode accommodated in the part of the insulating film.

In accordance with another aspect of the present invention, there is provided a process of fabricating a field effect transistor comprising the steps of: (a) preparing a semiconductor substrate of a first conductivity type having an upper surface; (b) forming a first insulating film on the upper surface of the semiconductor substrate, the first insulating film having an upper surface; (c) forming a first cavity in the first insulating film, the first cavity being open at one end thereof to the upper surface of the semiconductor substrate and at the other end thereof to the upper surface of the first insulating film; (d) filling the first cavity with a semiconductor material of the first conductivity type having an upper surface; (e) covering a part of the upper surface of the semiconductor material with a first mask; (f) forming a second mask on the upper surface of the semiconductor material, the second mask being located in the neighborhood of the first mask; (g) doping the semiconductor material with impurity atoms of a second conductivity type opposite to the first conductivity type using the first and second masks for preventing a part of the semiconductor material covered with the first and second masks from the impurity atoms, thereby forming an impurity region of the second conductivity type; (h) removing the second mask; (i) forming a second cavity partially in the impurity region and partially in the semiconductor material; (j) forming a second insulating film covering edge surfaces of the semiconductor material and the impurity region, the edge surfaces defining the second cavity, a part of the second insulating film covering the edge surface of the semiconductor material providing a gate insulating film; and (k) forming a gate electrode in the second cavity.

BRIEF DESCRIPTION OF THE DRAWINGS

The features and advantages of a according to the present invention will be more clearly understood from the following description taken in conjunction with the accompanying drawings in which.

DESCRIPTION OF THE PREFERRED EMBODIMENTS

Figure 1:
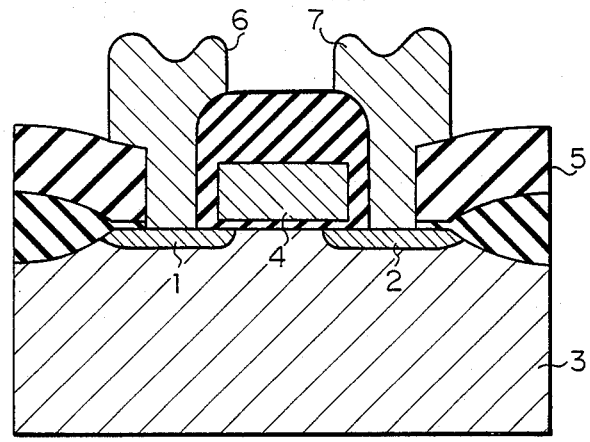
FIG. 1 is a cross sectional view showing a typical example of a MIS-type field effect transistor with shallow source and drain regions.
Figure 2:
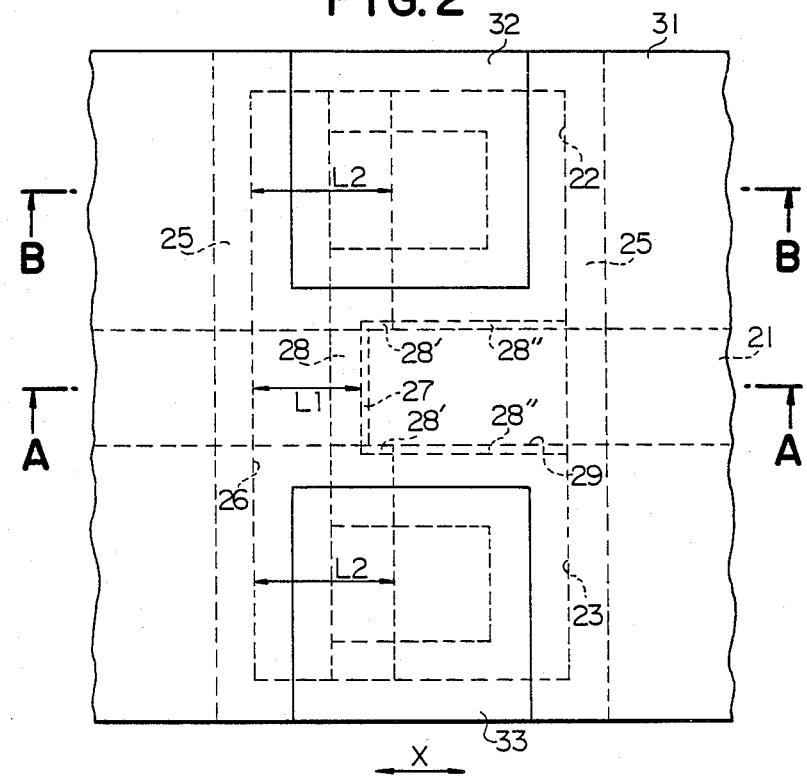
FIG. 2 is a plan view showing the layout of a MIS-type field effect transistor embodying the present invention.
Figure 3:
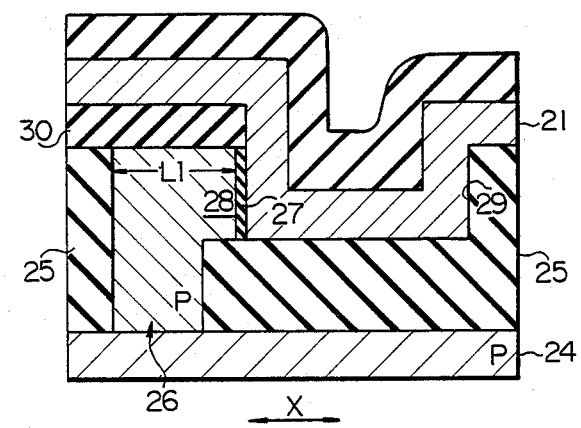
FIG. 3 is a cross sectional view taken along the line A—A of FIG. 2 and showing the structure of the MIS-type field effect transistor focusing upon the gate electrode thereof.
Figure 4:
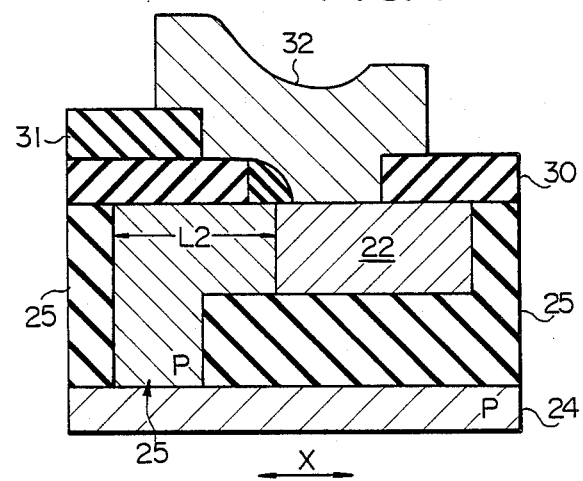
FIG. 4 is a cross sectional view taken along the line B—B of FIG. 2 and showing the structure of the MIS-type field effect transistor focusing upon the source/drain region thereof.

Referring to FIG. 2 of the drawings, there is shown the layout of a MIS-type field effect transistor embodying the present invention. Two different vertical sections are shown in FIGS. 3 and 4 focusing upon gate electrode 21 and one of source and drain regions 22 and 23, respectively. As will be seen from FIGS. 3 and 4, the MIS-type field effect transistor is fabricated on a p-type single crystal silicon substrate 24 and the p-type silicon substrate 24 is covered with a thick insulating film 25 of a silicon oxide. A p-type epitaxial layer 26 is formed in the thick insulating film 25 and has a generally inverted L-shape in cross section. Comparing the vertical section illustrated in FIG. 3 with the vertical section illustrated in FIG. 4, it will be understood that the p-type epitaxial layer 26 has lengths L1 and L2 different from each other. Namely, the p-type epitaxial layer 26 has the relatively short length L1 in the neighborhood of a part of a gate insulating film 27 which is in contact with a leading end of the gate electrode 21. Parts of the gate insulating film 28' extend along the respective inner surfaces of the p-type epitaxial layer 26 with the relatively long length L2, and, for this reason, a channel region 28 takes place in the p-type epitaxial layer 26 between the source and drain regions 22 and 23 upon application of biasing voltage to the gate electrode 21. On the other hand, the p-type epitaxial layer 26 with the relatively long length L2 is in contact with the heavily-doped n-type source and drain regions 22 and 23, and the heavily-doped n-type source and drain regions 22 and 23 are in contact with insulating films 28'''' which in turn is in contact with the gate electrode 21. The channel region 28 takes place over the p-type epitaxial layer 26 with relatively short length L1 and the relatively long length L2 so that the channel region 28 has a tumbled U-shape in FIG. 2, thereby increasing in effective channel length. The heavily-doped n-type source and drain regions 22 and 23 are caused to deviate from the central area of the channel region 28 in the lateral direction X of the structure. For these reason, the short-channel effects hardly take place under the usual operation. In other words, the gate electrode 21 accommodated in a cavity 29 formed in the thick insulating film 25 intervenes between the source and drain regions 22 and 23, and each of the source and drain regions 22 and 23 has a thickness of about 0.3 micron and a impurity atom concentration of about $2 \times 10^{20}$ atoms/cm$^3$. The gate electrode 21 has a length scaled down into the submicron region.

The p-type epitaxial layer 26 and the heavily-doped n-type source and drain regions 22 and 23 are covered with an insulating film 30 of, for example, a silicon oxide, and the insulating film 30 is partially removed to allow the cavity 29 to be open. The gate electrode 21 extends on the insulating film 29 and bends down into the cavity 29, so that the gate electrode 21 is partially in contact with the gate insulating film 27 and 28' as shown in FIG. 3. The gate electrode 21 is covered with an insulating film 31, and contact windows are formed in the insulating films 30 and 31 for the source and drain regions 22 and 23. Then, metal wiring layers 32 and 33 of, for example, aluminum are formed on the insulating film 31 and have respective protrusions which are in contact with the source and drain regions 22 and 23 through the contact windows, respectively.

As will be better seen from FIG. 3 of the drawings, the heavily-doped n-type source and drain regions 22 and 23 are formed on the thick insulating film 25, so that no aluminum spike can penetrate the thick insulating film 25.

In operation, when a positive biasing voltage is applied to the gate electrode, the channel region 28 takes place in the p-type epitaxial layer 26, so that a current flows between the source and drain regions 22 and 23. The source and drain regions 22 and 23 are sufficient in thickness and in impurity atom concentration, so that the current is merely subjected to a relatively small resistance.

However, no channel region takes place in the absence of the positive biasing voltage. In this situation, depletion layers extend from the respective source and drain junctions. The channel regions 28 is increased in length, so that the depletion layers are hardly merged with each other. Then, the short-channel effects do not take place under the usual operation.

Figure 5A:
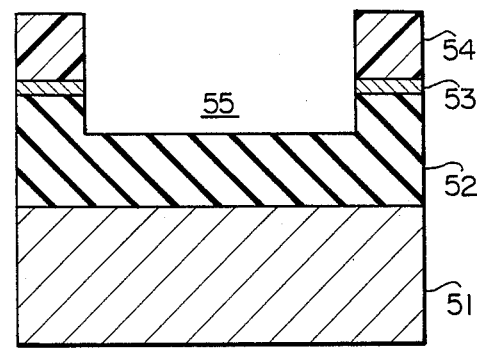
FIGS. 5A to 5I are cross sectional views showing a sequence of process steps for fabricating the MIS-type field effect transistor illustrated in FIGS. 2 to 4.
Figure 5B:
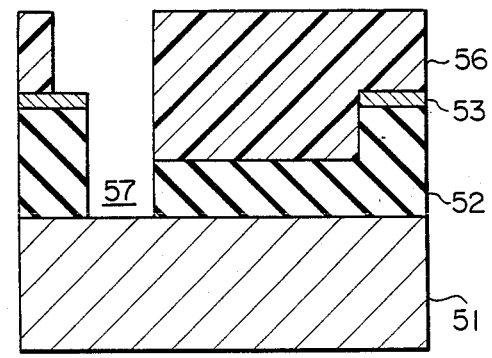
Figure 5C:
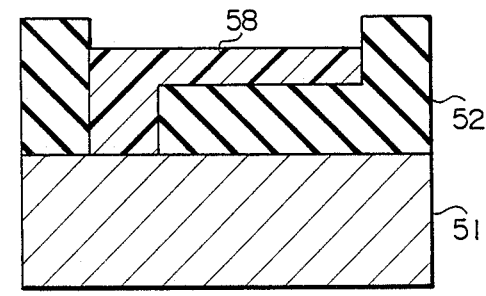
Figure 5D:
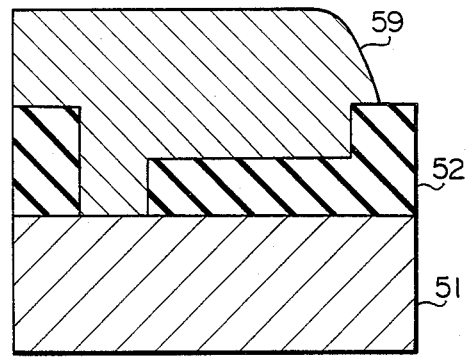
Figure 5E:
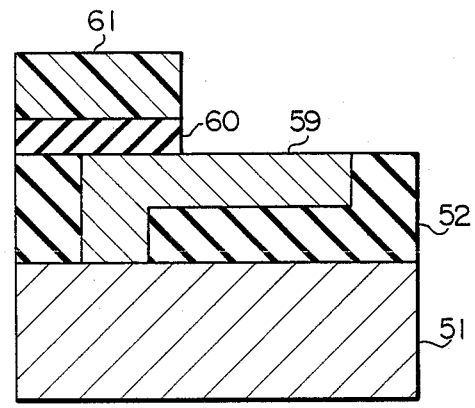
Figure 5F:
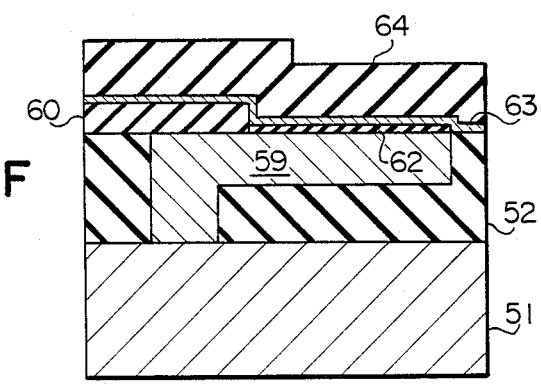
Figure 5G:
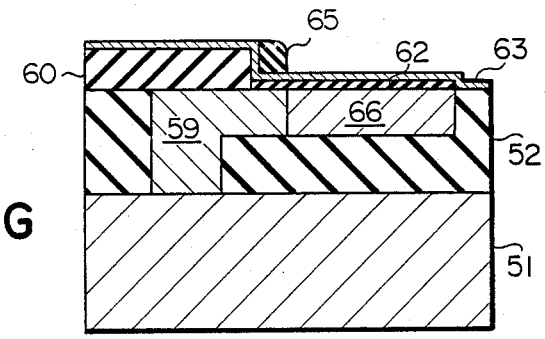
Figure 5H:
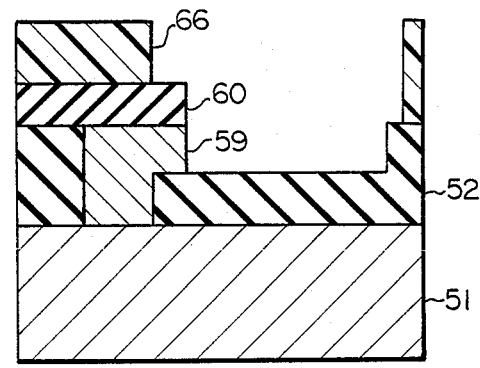
Figure 5I:
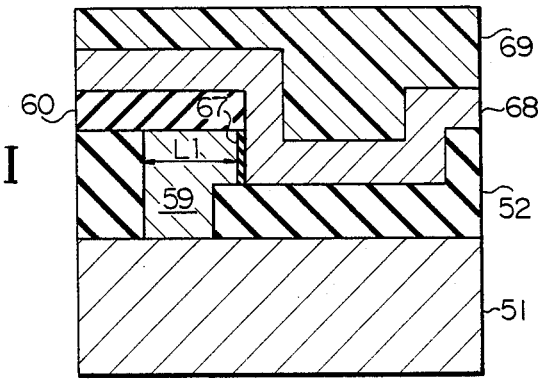
Figure 6A:
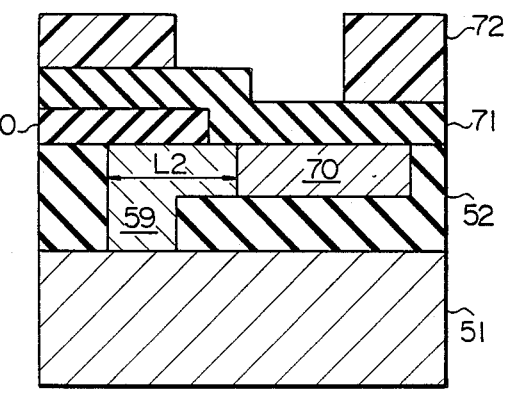
FIGS. 6A and 6B are cross sectional views showing a part of the process sequence in a different vertical section from that shown in FIGS. 5A to 5I.
Figure 6B:
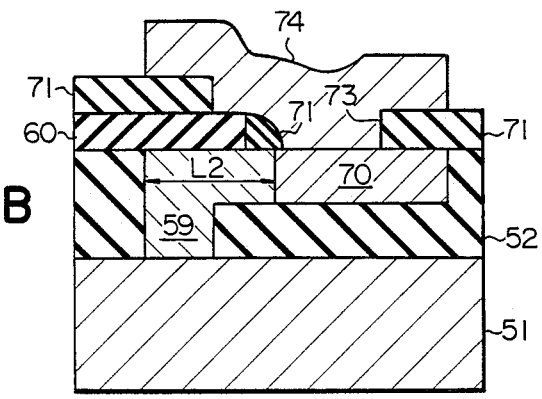

Description is hereinunder made for a process of fabricating the MIS-type field effect transistor shown in FIGS. 2 to 4 with reference to FIGS. 5A to 5I and to FIGS. 6A and 6B. The process starts with a p-type single crystal silicon substrate 51, and the silicon substrate 51 is placed in a high-temperature oxidation ambient, so that a silicon oxide is grown to form a thick insulating film 52. A polysilicon film 53 is deposited on the entire surface of the thick insulating film 52 by using a entire surface of the thick insulating film 52 by using a chemical vapor deposition technique, and a photoresist material is spun onto the polysilicon film 53 for forming a photoresist film which is patterned to form a photomask 54. The polysilicon film 53 and the thick insulating film 52 are partially etched away so as to transfer the pattern by using a reactive ion etching technique. Then, a groove 55 is formed in the thick insulating film 52, and the groove 55 has a depth approximately equal to a gate width of the MIS-type field effect transistor shown in FIGS. 2 to 4. The resultant structure of this stage is illustrated in FIG. 5A.

The photomask 54 is striped off, and a photoresist material is applied to the entire surface of the structure shown in FIG. 5A again, and the photoresist material is partially removed to form a photomask 56 exposing a part of the bottom surface of the groove 55. The thick insulating film 52 is then partially removed to form an opening extending from the bottom surface of the groove 55 to the upper surface of the silicon substrate 51 by using the reactive ion etching technique. The resultant structure of this stage is illustrated in FIG. 5B.

When the photomask 56 is stripped off, a generally inverted L-shaped hollow space is formed in the thick insulating film 52. A photoresist material is spun onto the entire surface of the structure shown in FIG. 5B to a thickness sufficient to create a smooth topography, and the photoresist material is uniformly removed until the polysilicon film 53 and the upper portion of the thick insulating film is exposed by using an reactive ion etching technique, so that a photomask 58 is formed in the generally inverted L-shaped hollow space. The polysilicon film 53 is removed by the reactive ion etching technique using the photomask 58, and the resultant structure is illustrated in FIG. 5C.

After the photomask 58 is removed, a silicon layer 59 is epitaxially grown on the silicon substrate 51, so that the generally inverted L-shaped hollow space is filled with the silicon layer 59 which in turn protrudes over the upper surface of the thick insulating film 52 as illustrated in FIG. 5D.

Subsequently, the silicon layer 59 is uniformly removed until the upper surface of the silicon layer 59 is coplanar with that of the thick insulating film 52 by using a selective abrasing technique, and the silicon layer 59 in the generally inverted L-shaped hollow space is doped with p-type impurity atoms. A silicon oxide is deposited on the entire surface of the structure to form an insulating film 60, and a photoresist material is spun onto the insulating film 60. The photoresist material is partially etched away to form a photomask 61, then the insulating film 60 is partially removed by an etching technique. The insulating film 60 has an edge surface located over that area where an gate electrode is formed in a latter stage. The resultant structure is illustrated in FIG. 5E.

After the photomask 61 is stripped off, the structure is placed in a high-temperature oxidation ambient, so that a thin silicon oxide film 62 is grown on the silicon layer 59 in the generally inverted L-shaped hollow space. A polysilicon film 63 and a silicon oxide film 64 are successively deposited on the entire surface of the structure as illustrated in FIG. 5F, and the polysilicon film 63 serves as an etching stopper.

The silicon oxide film 64 is anisotropically etched away by using an reactive ion etching technique, so that a masking block 65 remains on the polysilicon film 63 forming a step configuration. The width of the masking block is proportional to the thickness of the insulating film 60. N-type impurity atoms are implanted into the silicon layer 59 using the insulating film 60 and the masking block 65 as a mask, and the implanted n-type impurity atoms are driven into the silicon layer 59, then heavily doped n-type impurity region 66 is formed in the silicon layer 59 as illustrated in FIG. 5G. The heavily doped n-type impurity region 66 provides source and drain regions which are not shown in FIG. 5G but described with reference to FIGS. 6A and 6B. In this instance, each of the source and drain regions has an impurity atom concentration of about $2 \times 10^{20}$ atoms/cm$^3$.

After removing the masking block 65, the polysilicon film 63 and the thin silicon oxide film 62, a photoresist material is applied on the entire surface of the structure, and the photoresist material is partially removed to form a photomask 66 exposing the heavily doped n-type impurity region 66 except for the source and drain regions. Then, the heavily doped n-type impurity region 66 and a part of the silicon layer 59 contiguous to the heavily doped n-type impurity region 66 are etched away by using the reactive ion etching technique using the photomask and the insulating film 60 as a mask structure. The resultant structure of this stage is illustrated in FIG. 5H.

After the photomask 66 is stripped off, the structure is placed in a high-temperature oxidation ambient, then the edge surface of the silicon layer 59 and the edge surface of the heavily doped n-type impurity region 66 are thermally oxidized to provide a gate insulating film 67 and an insulation between a gate electrode and the source and drain regions, respectively. Since the impurity regions 66 has the heavy impurity concentration, the silicon oxide films covering the impurity region 66 are greater in thickness than the gate insulating film 67. For this reason, the field effect transistor has a large withstand voltage between the gate electrode and the impurity region 66. Subsequently, a heavily doped n-type polysilicon film 68 is deposited on the entire surface of the structure, and, then, a photoresist material is applied on the doped polysilicon film 68. The photoresist film 69 is partially removed to form a photomask 69 as illustrated in FIG. 5I, and the doped polysilicon film 68 is patterned to form a gate electrode by the reactive etching technique. Thus, the silicon layer 59 with a relatively short length L1 is brought into contact with the gate insulating film 67 which in turn in contact with the gate electrode.

As described in conjunction with the formation of the gate electrode, the heavily doped n-type impurity region 66 is partially removed but partially remains for providing the source and drain regions. One of the source and drain regions is shown in FIG. 6A and designated by reference numeral 70. The boundaries between the p-type silicon layer 59 and the source and drain regions have been defined by the masking block 65, so that the source and drain regions are in contact with the silicon layer having a relatively long length L2. After formation of the gate electrode, a silicon oxide is deposited on the entire surface of the structure by using a chemical vapor deposition technique to form an inter-level insulating film 71, and, thereafter, a photoresist material is applied on the entire surface of the inter-level insulating film 71. The photoresist material 72 is partially removed to form a photomask 72 as illustrated in FIG. 6A. In this instance, the edge of the photomask located over the insulating film 60 deviates from an edge of a contact window forming area, however there is no problem because the lower insulating film 60 also serves as a part of an etching mask.

Subsequently, the inter-level insulating film 71 is partially etched away using the photomask 72 and the insulating films 60 and 71 as the etching mask to form a contact window 73, and the photomask 72 is etched away by using a reactive etching technique. An aluminum film is deposited on the entire surface of the structure and etched and patterned to form the metal wiring layer 74. The inter-level insulating film 71 is remains in the neighborhood of the insulating film 60, so that the metal wiring film 74 is brought into contact with the source/drain region 70 in a self-aligned manner. The resultant structure is illustrated in FIG. 6B. The structure of the MIS-type field effect transistor has the source and drain regions formed in the insulating film 52, so that no aluminum spike reaches the silicon substrate 51 and the profiles of the source and drain regions are not liable to be subjected to a heat attack during the latter process steps.

Although particular embodiment of the present invention have been shown and described, it will be obvious to those skilled in the art that various changes and modifications may be made without departing from the spirit and scope of the present invention.

What is claimed is:

1. A field effect transistor fabricated on a semiconductor substrate of a first conductivity type, comprising:

(a) an insulating layer formed on said semiconductor substrate and upwardly extending from a major surface of the semiconductor substrate;

(b) a semiconductor layer of said first conductivity type formed in said insulating layer and having relatively long protrusions and a relatively short protrusion located between the relatively long protrusions, a bottom surface of said semiconductor layer being in contact with said semiconductor substrate, said relatively long protrusions and said relatively short protrusion laterally projecting from an upper portion of said semiconductor layer;

(c) a gate insulating film covering a leading end surface of said relatively short protrusion and respective inner side surfaces of said relatively long protrusions;

(d) a gate electrode formed in said insulating layer and contacting to said gate insulating film;

(e) source and drain regions of a second conductivity type formed in said insulating layer and contacting to respective leading ends of said relatively long protrusions for forming P-N junctions, respectively, bottom surface of said source and drain regions being in contact with an upper surface of said insulating layer;

(f) an upper insulating film covering said relatively long protrusions, said relatively short protrusion and said source and drain regions and formed with source and drain contact windows partially exposing upper surfaces of said source and drain regions, respectively, said p-n junctions being located under said upper insulating film; and (g) source and drain electrodes formed on said upper insulating layer and respectively projecting through said source and drain contact windows so as to be in contact with the upper surfaces of said source and drain regions, respectively, wherein said source and drain regions are separated from each other by a part of said insulating layer and said gate electrode accommodated in the part of the insulating layer.

2. A field effect transistor as set forth in claim 1, in which said gate electrode has a length of submicron.

3. A field effect transistor as set forth in claim 2, in which said semiconductor substrate is formed of a p-type single crystal silicon.

4. A field effect transistor as set forth in claim 3, in which said insulating layer is formed of a silicon oxide.

5. A field effect transistor as set forth in claim 4, in which said semiconductor layer is formed of an epitaxial silicon.

6. A field effect transistor as set forth in claim 5, in which said gate insulating film is formed of a silicon oxide.

7. A field effect transistor as set forth in claim 6, in which said gate electrode is formed of a heavily doped n-type polysilicon.

8. A field effect transistor as set forth in claim 7, in which said source and drain regions are formed of a heavily doped n-type silicon.

9. A field effect transistor as set forth in claim 8, in which each of said source and drain regions has a thickness of about 0.3 micron and an impurity atom concentration of about $2 \times 10^{20}$ atoms/cm$^3$.

* * * * *